US011359618B2

(12) United States Patent
Mou et al.

(10) Patent No.: US 11,359,618 B2
(45) Date of Patent: Jun. 14, 2022

(54) CONTROL METHOD OF FLUID DEVICE

(71) Applicant: Microjet Technology Co., Ltd., Hsinchu (TW)

(72) Inventors: Hao-Jan Mou, Hsinchu (TW); Rong-Ho Yu, Hsinchu (TW); Cheng-Ming Chang, Hsinchu (TW); Hsien-Chung Tai, Hsinchu (TW); Wen-Hsiung Liao, Hsinchu (TW); Chang-Yen Tsai, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 193 days.

(21) Appl. No.: 16/110,204

(22) Filed: Aug. 23, 2018

(65) Prior Publication Data

US 2019/0101939 A1 Apr. 4, 2019

(30) Foreign Application Priority Data

Sep. 30, 2017 (TW) .................... 106133850

(51) Int. Cl.
*F04B 43/02* (2006.01)
*F04B 43/04* (2006.01)
(Continued)

(52) U.S. Cl.
CPC ........ *F04B 43/026* (2013.01); *F04B 43/0081* (2013.01); *F04B 43/046* (2013.01);
(Continued)

(58) Field of Classification Search
CPC . G05D 7/0694; F04B 43/026; F04B 43/0081; F04B 43/046; F04B 45/047;
(Continued)

(56) References Cited

U.S. PATENT DOCUMENTS

2005/0037471 A1 2/2005 Liu et al.
2007/0020124 A1* 1/2007 Singhal ............... F04B 53/1077
417/413.2
(Continued)

FOREIGN PATENT DOCUMENTS

CN 103026066 A 4/2013
CN 106030108 A 10/2016
(Continued)

OTHER PUBLICATIONS

Extended European Search Report dated Oct. 24, 2018 for Application No. 18190433.5.

*Primary Examiner* — Philip E Stimpert
(74) *Attorney, Agent, or Firm* — Birch, Stewart, Kolasch & Birch, LLP

(57) ABSTRACT

The present disclosure provides a control method of a fluid device. The control method includes the steps of (a) providing the fluid device, which includes a plurality of flow guiding units manufactured by a micro-electro-mechanical-system process; (b) dividing the flow guiding units into a plurality of groups, which are electrically connected to and controlled by a control module; and (c) generating a driving signal by the control module for a corresponding one of the groups, wherein the control module generates a high level signal to a specific one of the groups, so that the flow guiding units of the specific one of the groups are driven to transport fluid, and thereby controlling the fluid device to discharge a specific amount of fluid.

6 Claims, 12 Drawing Sheets

(51) Int. Cl.
*F04B 43/00* (2006.01)
*F04B 49/06* (2006.01)
*F04B 45/047* (2006.01)
*G05D 7/06* (2006.01)
*H01L 41/09* (2006.01)
*H01L 41/318* (2013.01)
*H01L 41/04* (2006.01)
*F16K 99/00* (2006.01)

(52) U.S. Cl.
CPC .......... *F04B 45/047* (2013.01); *F04B 49/065* (2013.01); *G05D 7/0694* (2013.01); *H01L 41/042* (2013.01); *H01L 41/0973* (2013.01); *H01L 41/318* (2013.01); *F16K 99/0015* (2013.01); *F16K 99/0048* (2013.01); *F16K 2099/0086* (2013.01)

(58) Field of Classification Search
CPC ...... F04B 49/065; F04B 23/04; F04B 19/006; H01L 41/042; H01L 41/0973; H01L 41/318; F16K 99/0015; F16K 99/048; F16K 2099/0086
See application file for complete search history.

(56) References Cited

U.S. PATENT DOCUMENTS

| | | | | |
|---|---|---|---|---|
| 2012/0171062 | A1* | 7/2012 | Kodama | F04B 19/006 417/413.2 |
| 2014/0377099 | A1* | 12/2014 | Hsueh | F04B 49/22 417/413.2 |
| 2015/0059749 | A1* | 3/2015 | Nitta | A61M 16/0012 128/204.18 |
| 2015/0260181 | A1* | 9/2015 | Harvey | F04B 19/006 417/410.1 |
| 2015/0267695 | A1 | 9/2015 | Marsh | |
| 2017/0218942 | A1 | 8/2017 | Chen et al. | |

FOREIGN PATENT DOCUMENTS

| | | |
|---|---|---|
| CN | 205744376 U | 11/2016 |
| CN | 206035774 U | 3/2017 |
| TW | 201609437 A | 3/2016 |

* cited by examiner

CONTROL METHOD OF FLUID DEVICE

FIELD OF THE INVENTION

The present disclosure relates to a control method of a fluid device, and more particularly to a control method of a fluid device, which includes a plurality of flow guiding units divided into a plurality of groups to be controlled and to be driven group by group.

BACKGROUND OF THE INVENTION

With the rapid advancement of science and technology, the fluid devices are widely applied to various electronic devices and medical equipment for achieving various efficacies for different requirements by fluid transportation. In addition, since the electronic devices and medical equipment are developed toward miniaturization and thinning, the fluid devices tend to be designed correspondingly to have a miniaturized volume. Although the fluid device can be manufactured by a micro-electro-mechanical-system process for achieving the miniaturized design, the miniaturized volume may correspondingly affect the transportation efficiency of the fluid device. Therefore, how to improve the transportation efficiency of the fluid device has become an issue needed to be solved urgently. Moreover, how to control the miniaturized fluid device to discharge a specific amount of fluid is also the main subject of research and development of the present disclosure.

SUMMARY OF THE DISCLOSURE

An object of the present disclosure is to provide a control method of a fluid device. The miniature fluid device includes a plurality of flow guiding units integrally manufactured by a micro-electro-mechanical-system process, so as to improve the transportation efficiency. Moreover, the flow guiding units are divided into a plurality of groups to be controlled and to be driven group by group, so that the fluid device can be controlled to discharge a specific amount of fluid.

In accordance with an aspect of the present disclosure, a control method of a fluid device is provided. The control method includes steps of (a) providing the fluid device, which is integrally manufactured by a micro-electro-mechanical-system process, wherein a plurality of flow guiding units are manufactured by the micro-electro-mechanical-system process and are connected to each other so as to integrally form the fluid device; (b) dividing the flow guiding units into a plurality of groups so as to be controlled group by group, wherein the groups are electrically connected to a control module, and wherein any two adjacent ones of the flow guiding units are controlled to be driven asynchronously; and (c) generating a driving signal by the control module for a corresponding one of the groups, wherein the control module generates a high level signal to a specific one of the groups, so that the flow guiding units of the specific one of the groups are driven to transport fluid, and thereby controlling the fluid device to discharge a specific amount of fluid.

In accordance with another aspect of the present disclosure, a control method of a fluid device is provided. The control method includes steps of (a) providing the fluid device, which is integrally manufactured by a micro-electro-mechanical-system process, wherein a plurality of flow guiding units are manufactured by the micro-electro-mechanical-system process and are connected to each other so as to integrally form the fluid device; (b) dividing the flow guiding units into a plurality of groups so as to be controlled group by group, wherein the groups are electrically connected to and controlled by a control module; and (c) generating a driving signal by the control module for a corresponding one of the groups, wherein the control module generates a high level signal to a specific one of the groups, so that the flow guiding units of the specific one of the groups are driven to transport fluid, and thereby controlling the fluid device to discharge a specific amount of fluid.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 3:
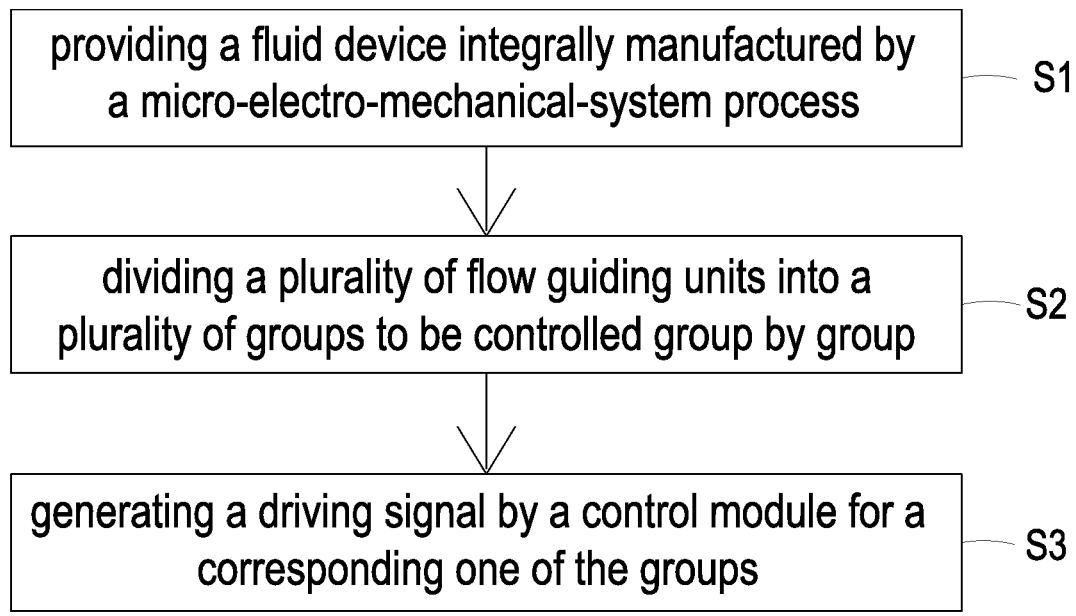
FIG. 3 is a flow chart illustrating a control method of the fluid device according to some embodiments of the present disclosure.

Referring to FIG. 3, the present disclosure provides a control method of a fluid device including a plurality of flow guiding units 101 to 140, a plurality of groups A1 to A4, B1 to B4, C1, C2, at least one control module 100, at least one driving signal and at least one high level signal. The numbers of the control module 100, the driving signal and the high level signal are exemplified by one for each respectively in the following embodiments, but are not limited thereto. It is noted that each of the control module 100, the driving signal and the high level signal can also be provided in plural numbers.

Figure 1:
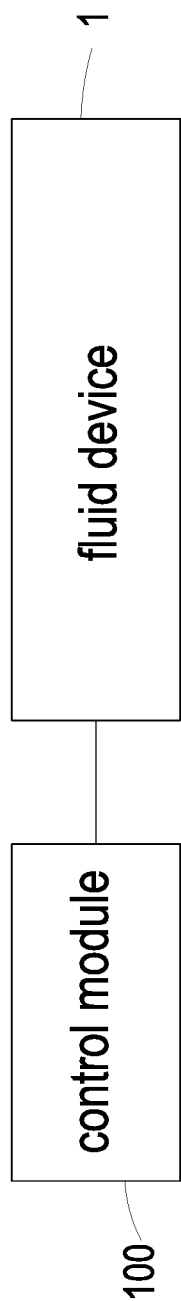
FIG. 1 is a block diagram illustrating a fluid device and a control module according to some embodiments of the present disclosure.
Figure 2A:
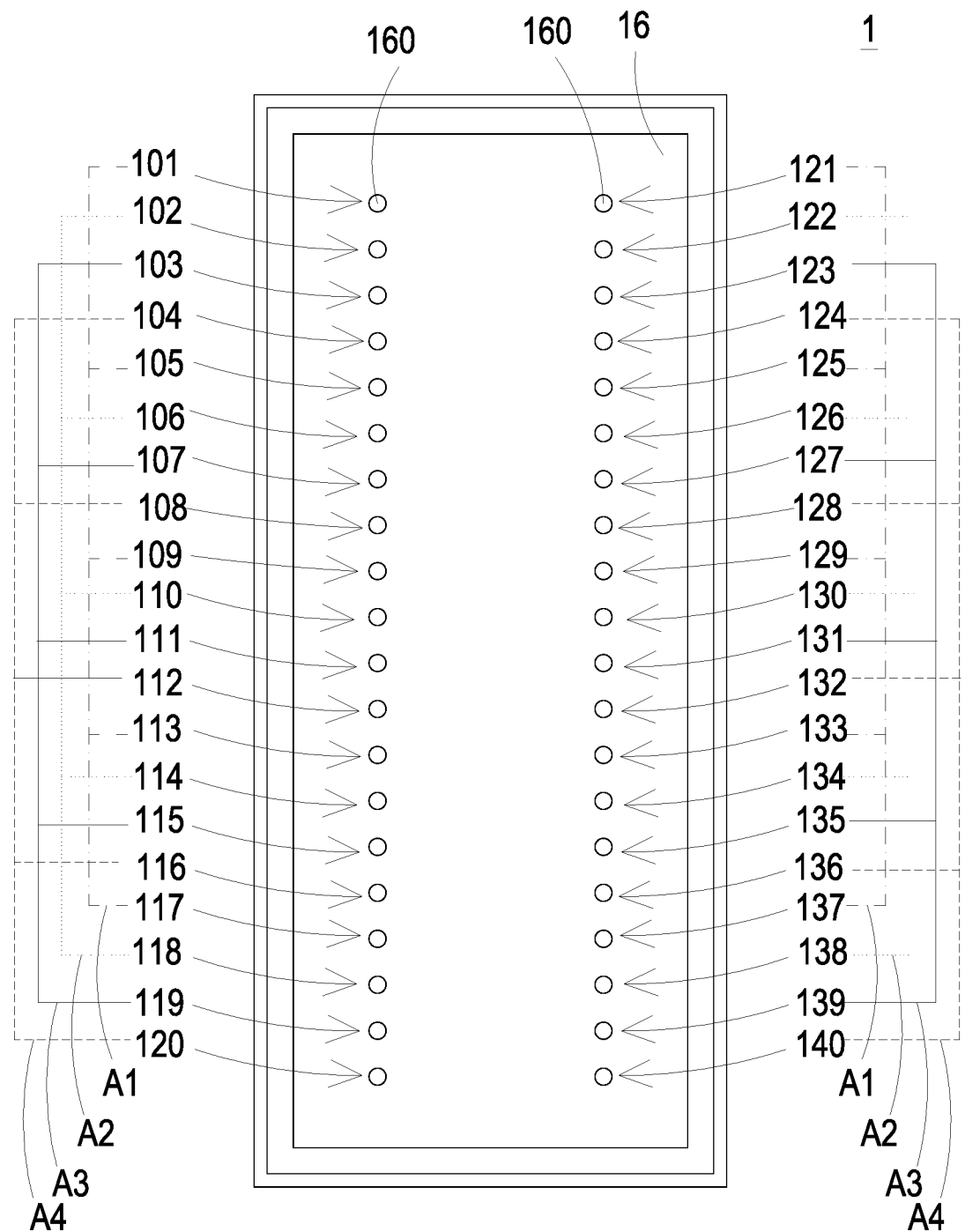
FIG. 2A is a schematic top view illustrating a first arrangement of a plurality of flow guiding units of the fluid device according to a first embodiment of the present disclosure.
Figure 2B:
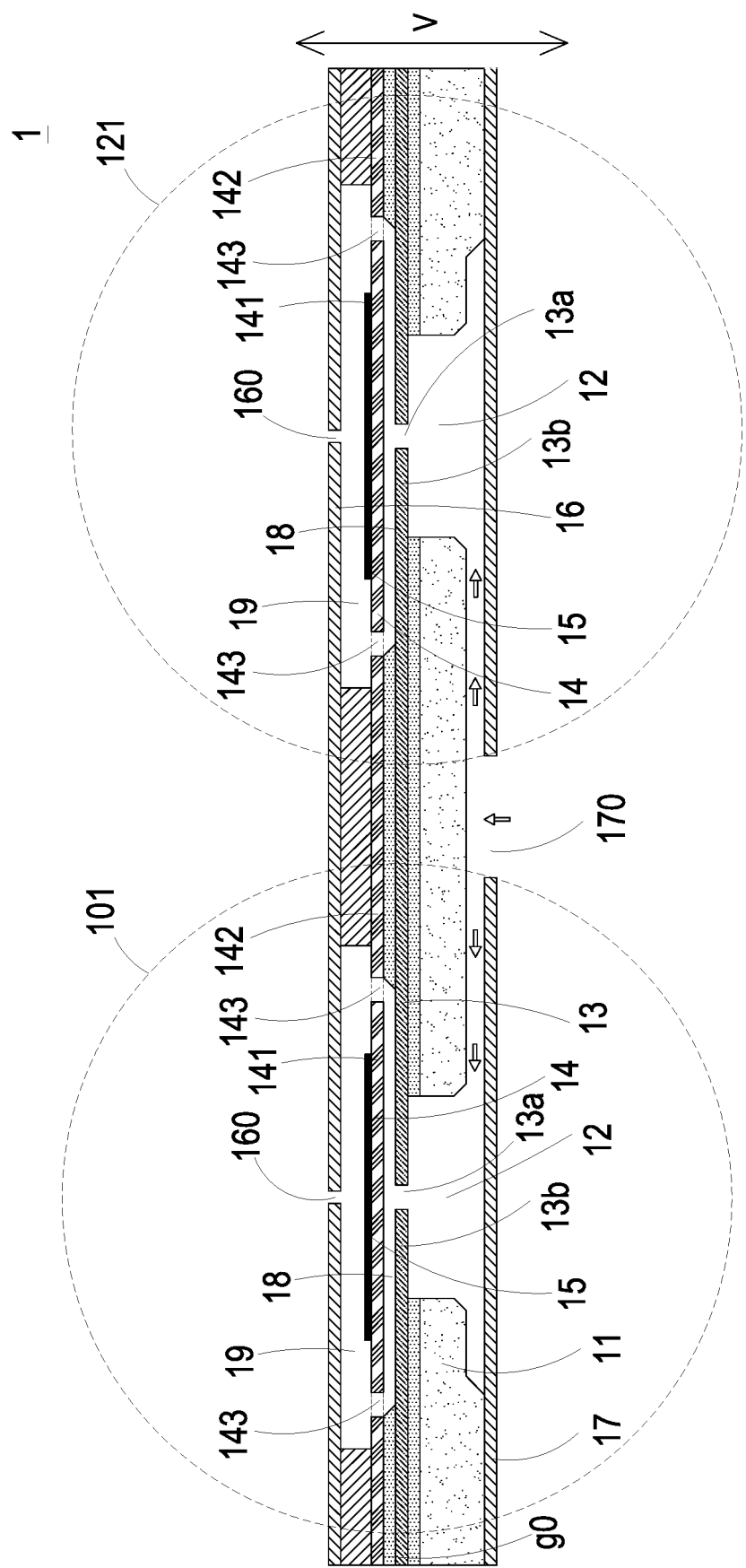
FIG. 2B is a cross-sectional view illustrating the fluid device in FIG. 2A.

FIG. 1 is a block diagram illustrating a fluid device and a control module according to some embodiments of the present disclosure. FIG. 2A is a schematic top view illustrating a first arrangement of a plurality of flow guiding units of the fluid device according to a first embodiment of the present disclosure. FIG. 2B is a cross-sectional view illustrating the fluid device in FIG. 2A. FIG. 3 is a flow chart illustrating a control method of the fluid device according to some embodiments of the present disclosure. The fluid device of the present disclosure is utilized to transport gas or liquid and is applicable to various electronic devices and medical equipment, such as a notebook computer, a mobile phone, a smart watch, a tablet computer and so on, but is not limited thereto. Firstly, referring to FIG. 1, a fluid device 1 is electrically connected to a control module 100. The control module 100 is disposed for controlling the actuating and deactivating of the fluid device 1.

For controlling the fluid device 1 to discharge a specific amount of fluid, the present disclosure provides a control method of the fluid device. FIG. 3 shows the processes of the control method according to some embodiments of the present disclosure. The implementation steps are described as follows.

Firstly, a fluid device 1 integrally manufactured by a micro-electro-mechanical-system (MEMS) process is provided at the step S1. Referring to FIGS. 2A and 2B, a plurality of flow guiding units 101 to 140 are manufactured by the MEMS process and are connected to each other to integrally form the fluid device 1. In the MEMS process, a surface of a material is micro-machined by means of dry and wet etching, so as to integrally form the miniature fluid device. The size of the fluid device 1 is small and thin, therefore, there is no need of stacking and machining the components as a conventional fluid device. The difficulty of controlling the dimensional accuracy is thereby avoided, and the quality of the product is stable and the yield rate is high. In order to facilitate the description of the structure of the fluid device 1 and the manner of fluid control, the following description will be proceeded with one flow guiding unit 101, but it is not limited to the present disclosure where there is only one flow guiding unit 101. The flow guiding units 101 to 140 having same structures may be utilized to construct the fluid device 1, and the number thereof may be varied according to the practical requirements. Each of the flow guiding units 101 to 140 can independently transport the fluid. The flow guiding unit 101 includes an inlet plate 17, a substrate 11, a resonance membrane 13, an actuating membrane 14, a piezoelectric membrane 15 and an outlet plate 16, which are sequentially stacked. The inlet plate 17 has an inlet aperture 170. The substrate 11 is made by means of a silicon bulk micromachining process, and has a fluid-inlet structure having a high aspect ratio. The mechanical properties and the Young's modulus of the silicon has are both similar to those of the steel. The yield strength of the silicon is twice greater than that of the steel, and the density of the silicon is one-third of that of the steel. In addition, the mechanical properties of the silicon are extremely stable. Therefore, it is suitable for the silicon to be applied in the dynamic microstructure of the present disclosure, but is not limited thereto. The materials of the substrate 11 may be varied according to the practical requirements. In some embodiments, the substrate 11 includes a driving circuit (not shown) electrically connected to an anode (not shown) and a cathode (not shown) of the piezoelectric membrane 15 so as to provide a driving power for the piezoelectric membrane 15, but is not limited thereto. In some other embodiments, the driving circuit may be disposed at any position within the fluid device 1. The present disclosure is not limited thereto and the disposition of the driving circuit may be varied according to the practical requirements.

In some embodiments, the resonance membrane 13 has a suspension structure manufactured by a surface micromachining process. The resonance membrane 13 further has a central aperture 13a and a movable part 13b. The movable part 13b is a flexible structure. The central aperture 13a is located at the center of the movable part 13b and extends through the resonance membrane 13. A convergence chamber 12 is formed between the resonance membrane 13 and the inlet plate 17. In some embodiments, the actuating membrane 14 is a metallic membrane or a polysilicon membrane, but is not limited thereto. The actuating membrane 14 has a hollow and suspension structure manufactured by the surface micromachining process. The actuating membrane 14 further has a suspension part 141 and an outer frame 142. The suspension part 141 is connected to the outer frame 142 through a plurality of connection parts (not shown), so that the suspension part 141 is suspended and elastically supported by the outer frame 142. A plurality of interspaces 143 are defined between the suspension part 141 and the outer frame 142, and are disposed for allowing the fluid to flow therethrough. The disposition, the types and the numbers of the suspension part 141, the outer frame 142 and the interspaces 143 may be varied according to the practical requirements, but not limited thereto. In some embodiments, the piezoelectric membrane 15 is disposed for being driven to driven the actuating membrane 14. The piezoelectric membrane 15 is a metal oxide membrane made by a sol-gel process, but is not limited thereto. The piezoelectric membrane 15 is attached on a first surface of the suspension part 141 of the actuating membrane 14, so as to drive the actuating membrane 14 to vibrate in a vibration direction (V) in a reciprocating manner and to further drive the resonance membrane 13 to vibrate in resonance. The outlet plate 160 has an outlet aperture 160. In addition, a gap g0 formed between the resonance membrane 13 and the actuating membrane 14 is defined as a first chamber 18. A second chamber 19 is formed between the actuating membrane 14 and the outlet plate 16. The convergence chamber 12 is in communication with the first chamber 18 through the central aperture 13a of the resonance membrane. When the actuating membrane 14 is driven by the piezoelectric membrane 15, a pressure gradient occurs in the first chamber 18 between the resonance membrane 13 and the actuating membrane 14. Consequently, the fluid is driven to flow into the convergence chamber 12 through the inlet aperture 170 of the inlet plate 17. The fluid is then transported into the first chamber 18 through the central aperture 13a of the resonance membrane 13 and is further transported into the second chamber 19 through the at least one interspace 143. Finally, the fluid is discharged out from the outlet aperture 160 of the outlet plate 16, so as to control the flowing of the fluid.

Next, the flow guiding units 101 to 140 are divided into a plurality of groups so as to be controlled group by group at the step S2. As shown in FIG. 2A, the groups are electrically connected to the control module 100. In a first arrangement of a first embodiment, any two adjacent ones of the flow guiding units 101 to 140 are controlled to be driven asynchronously. Namely, the two adjacent ones of the flow guiding units 101 to 140 are not driven at the same time. For example, the flow guiding unit 101 and the flow guiding unit 102 are assigned to different groups and are driven asynchronously, the flow guiding unit 102 and the flow guiding unit 103 are assigned to different groups and are driven asynchronously, and the flow guiding unit 103 and the flow guiding unit 104 are assigned to different groups and are driven asynchronously. In the first embodiment, the flow guiding units 101, 105, 109, 113, 117, 121, 125, 129, 133 and 137 are grouped together to form a first group A1. The flow guiding units 102, 106, 110, 114, 118, 122, 126, 130, 134 and 138 are grouped together to form a second group A2. The flow guiding units 103, 107, 111, 115, 119, 123, 127, 131, 135 and 139 are grouped together to form a third group A3. The flow guiding units 104, 108, 112, 116, 120, 124, 128, 132, 136 and 140 are grouped together to form a fourth group A4. In this way, the flow guiding units 101 to 140 of the fluid device 1 are divided into four groups A1, A2, A3 and A4, which are electrically connected to the control module 100, but are not limited thereto. The number of the groups and the combination to form each of the groups are adjustable according to the practical requirements. Moreover, the configuration that any two adjacent ones of the flow guiding units 101 to 140 are driven asynchronously prevents the two adjacent ones of the flow guiding units 101 to 140 from interfering with each other. As a result, an effect on the amount of fluid to be discharged is also prevented, and thereby achieving a high transportation efficiency.

Next, the control module 100 generates a driving signal to respective corresponding one of the groups at the step S3. As shown in FIG. 2A, the control module 100 generates a high level signal to the first group A1 of the fluid device 1, so that the flow guiding units 101, 105, 109, 113, 117, 121, 125, 129, 133 and 137 of the first group A1 are driven to transport the fluid. Alternatively, the control module 100 generates the high level signal to the second group A2 of the fluid device 1, so that the flow guiding units 102, 106, 110, 114, 118, 122, 126, 130, 134 and 138 of the second group A2 are driven to transport the fluid. Alternatively, the control module 100 generates the high level signal to the third group A3 of the fluid device 1, so that the flow guiding units 103, 107, 111, 115, 119, 123, 127, 131, 135 and 139 of the third group A3 are driven to transport the fluid. Alternatively, the control module 100 generates the high level signal to the fourth group A4 of the fluid device 1, so that the flow guiding units 104, 108, 112, 116, 120, 124, 128, 132, 136 and 140 of the fourth group A4 are driven to transport the fluid. According to the above-mentioned descriptions, the control module 100 may respectively generate the high level signals to the groups A1 to A4 of the fluid device 1 so as to control the fluid device 1 to discharge a specific amount of fluid, but is not limited thereto. Alternatively, the control module 100 may simultaneously generate the high level signals to the groups A1 to A4 of the fluid device 1, so as to control the fluid device 1 to discharge the specific amount of fluid. Alternatively, the control module 100 may generate the high level signals to a specific combination of the groups A1 to A4 so as to control the fluid device 1 to discharge the specific amount of fluid.

Figure 4:
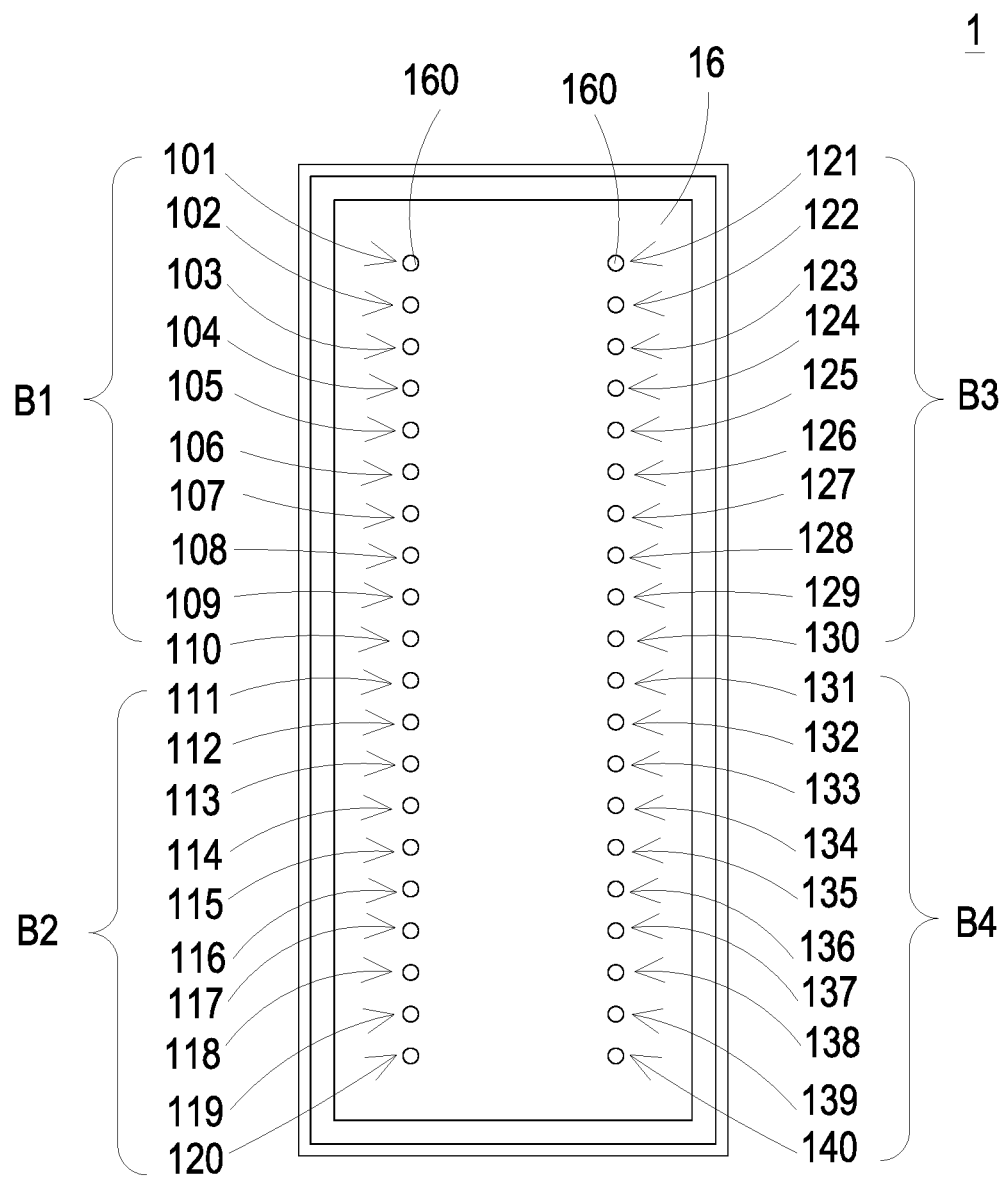
FIG. 4 is a schematic top view illustrating a second arrangement of the plurality of flow guiding units of the fluid device according to the first embodiment of the present disclosure.

FIG. 4 is a schematic top view illustrating a second arrangement of the plurality of flow guiding units of the fluid device according to the first embodiment of the present disclosure. The method of dividing the flow guiding units into the groups can be implemented as shown in FIG. 4. In a second arrangement of the first embodiment, a portion of the flow guiding units 101 to 140, that are arranged at the same side and that are adjacent to each other, are grouped together to form a group, and the group is electrically connected to and is controlled by the control module 100. Namely, the flow guiding units 101 to 110 are grouped together to form a first group B1, the flow guiding units 111 to 120 are grouped together to form a second group B2, the flow guiding units 121 to 130 are grouped together to form a third group B3, and the flow guiding units 131 to 140 are grouped together to form a fourth group B4. In this way, the flow guiding units 101 to 140 are divided into four groups B1, B2, B3 and B4, which are electrically connected to the control module 100, but are not limited thereto. The number of the flow guiding groups B1 to B4 and the combination of the flow guiding units 101 to 140 are adjustable according to the practical requirements. Similarly, the control module 100 generates the high level signal to a corresponding one of the groups B1 to B4 of the fluid device 1 so as to control the fluid device 1 to discharge a specific amount of fluid, thereby achieving high transportation efficiency. According to the above-mentioned descriptions, the control module 100 may respectively generate the high level signals to the groups B1 to B4 of the fluid device 1 so as to control the fluid device 1 to discharge a specific amount of fluid, but is not limited thereto. Alternatively, the control module 100 may simultaneously generate the high level signals to the groups B1 to B4 of the fluid device 1 so as to control the fluid device 1 to discharge the specific amount of fluid. Alternatively, the control module 100 may generate the high level signals to a specific combination of the groups B1 to B4 so as to control the fluid device 1 to discharge the specific amount of fluid.

Figure 5:
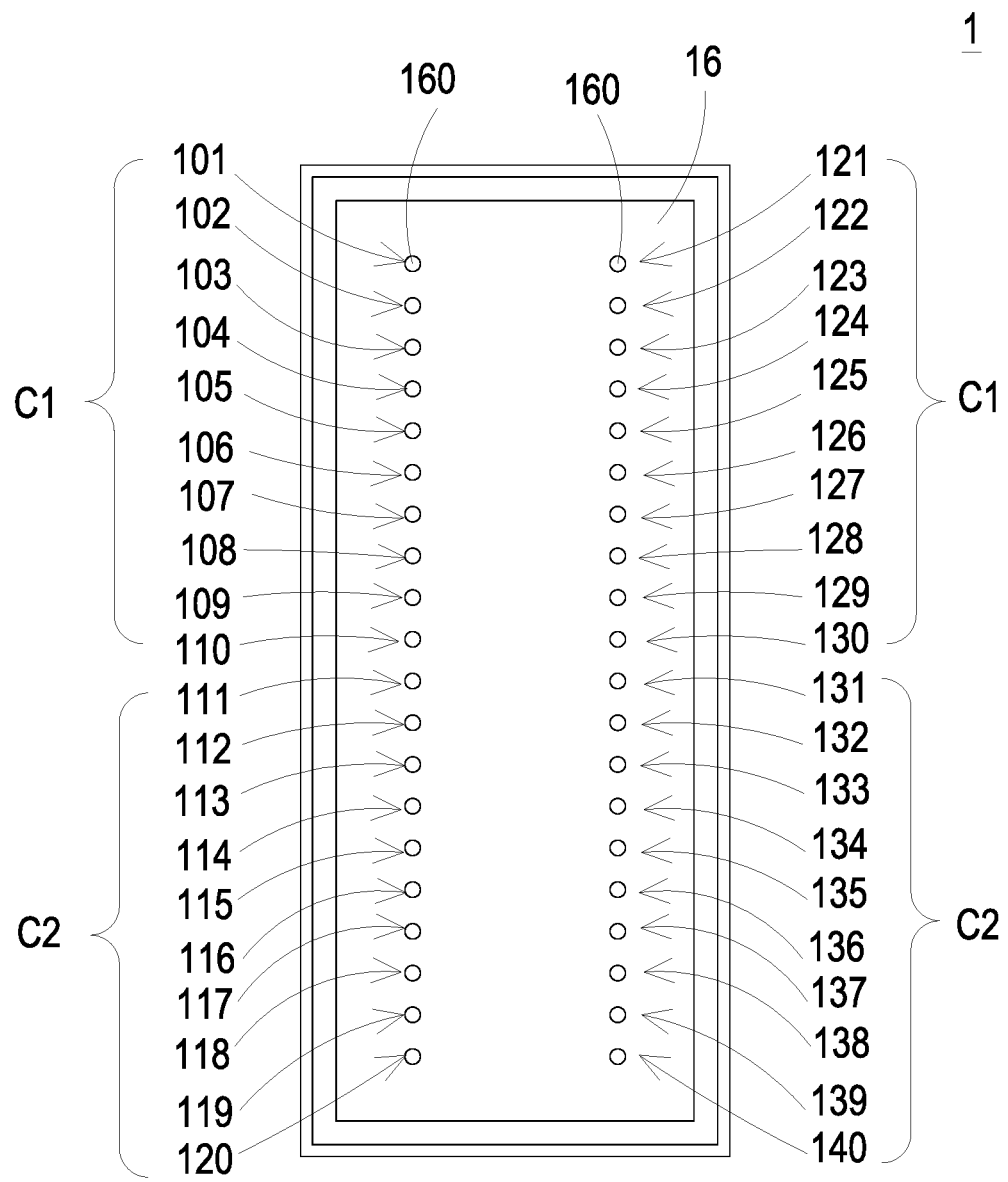
FIG. 5 is a schematic top view illustrating a third arrangement of the plurality of flow guiding units of the fluid device according to the first embodiment of the present disclosure.

FIG. 5 is a schematic top view illustrating a third arrangement of the plurality of flow guiding units of the fluid device according to the first embodiment of the present disclosure. The method of dividing the flow guiding units into the groups can be implemented as shown in FIG. 5. In a third arrangement of the first embodiment, a portion of the flow guiding units 101 to 140, that are not only adjacent to each other but also arranged in opposite rows, are grouped together to form a group, and the group is electrically connected to and is controlled by the control module 100. Namely, the flow guiding units 101 to 110 and the flow guiding units 121 to 130 are grouped together to form a first group C1, and the flow guiding units 111 to 120 and the flow guiding units 131 to 140 are grouped together to form a second group C2. In this way, the flow guiding units 101 to 140 are divided into two groups C1 and C1, which are electrically connected to the control module 100, but is not limited thereto. The number of the groups C1, C2 and the combination of the flow guiding units 101 to 140 are adjustable according to the practical requirements. According to the above-mentioned descriptions, the control module 100 may generate the high level signal to guiding corresponding one of the groups C1, C2 so as to control the fluid device 1 to discharge a specific amount of fluid, but is not limited thereto. Alternatively, the control module 100 may simultaneously generate the high level signals to the groups C1, C2 of the fluid device 1 so as to control the fluid device 1 to discharge the specific amount of fluid.

Figure 6A:
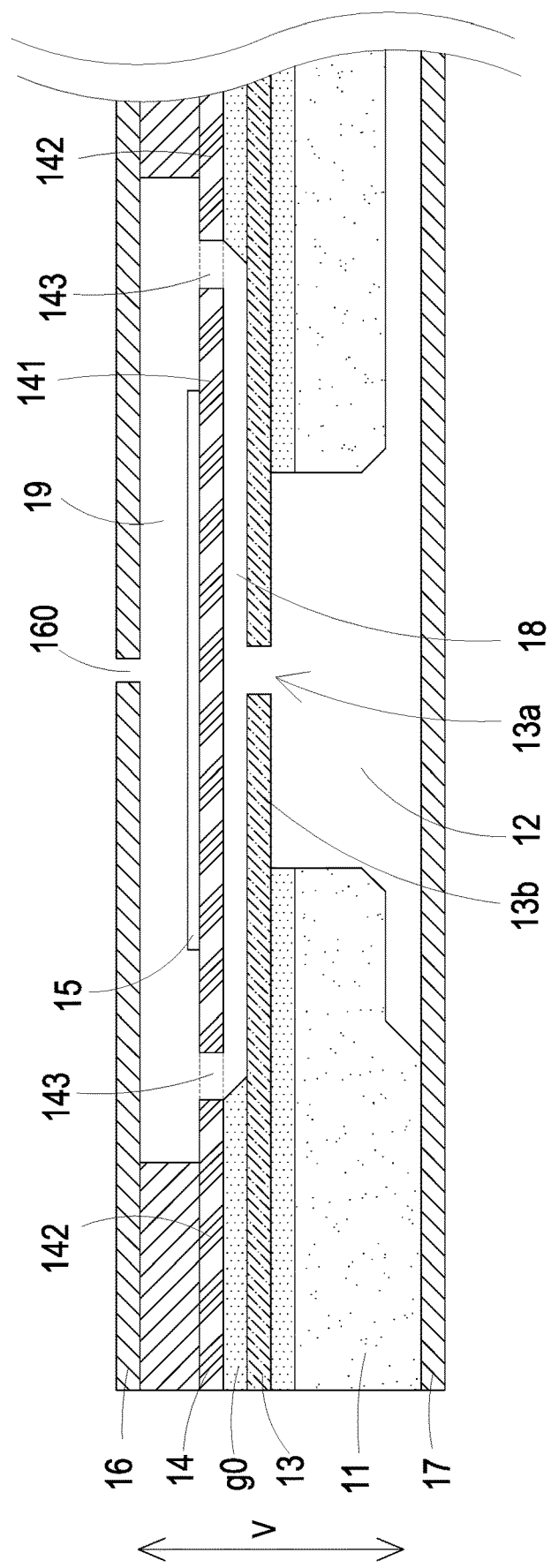
FIG. 6A is a fragmentary cross-sectional view illustrating one of the flow guiding units of the fluid device according to some embodiments of the present disclosure.
Figure 6B:
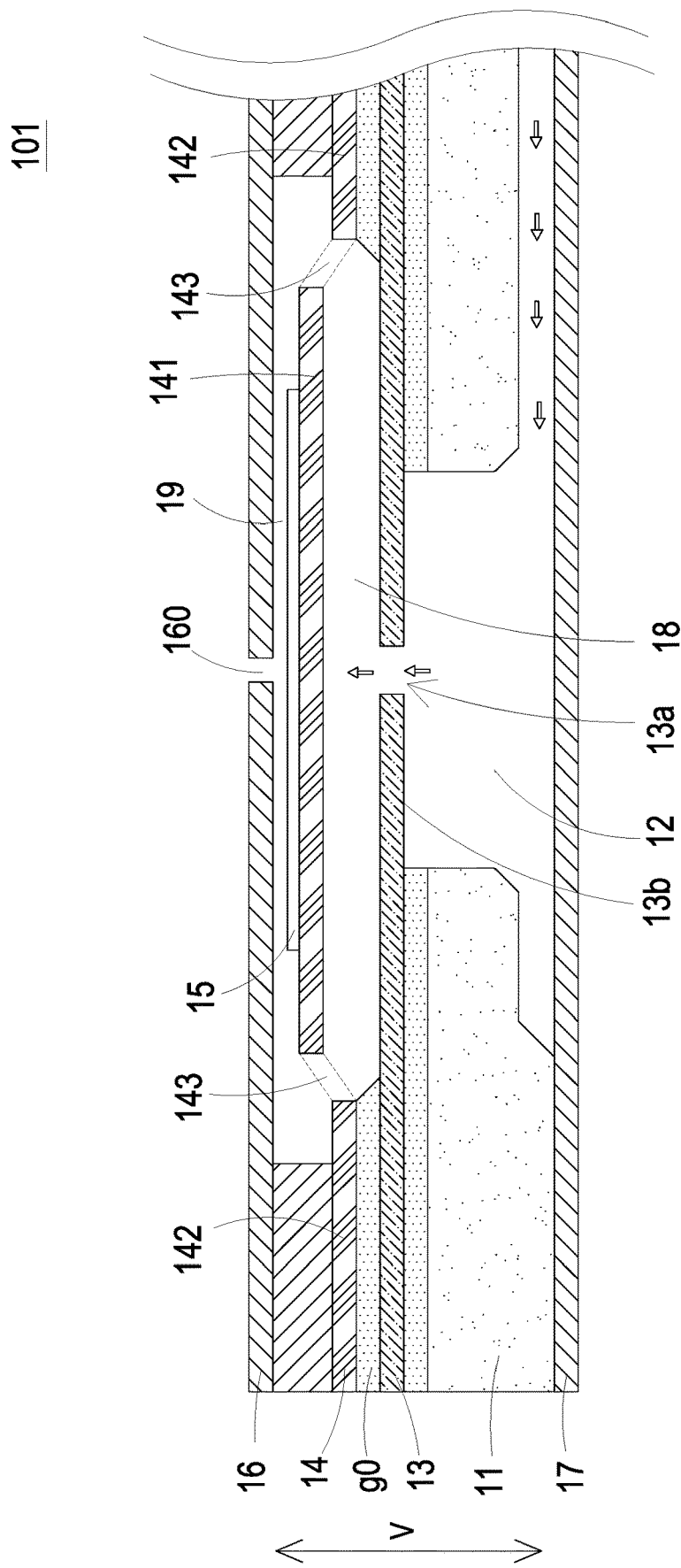
FIGS. 6B to 6D are schematic diagrams illustrating actuations of the one of the flow guiding units of the fluid device according to some embodiments of the present disclosure.
Figure 6C:
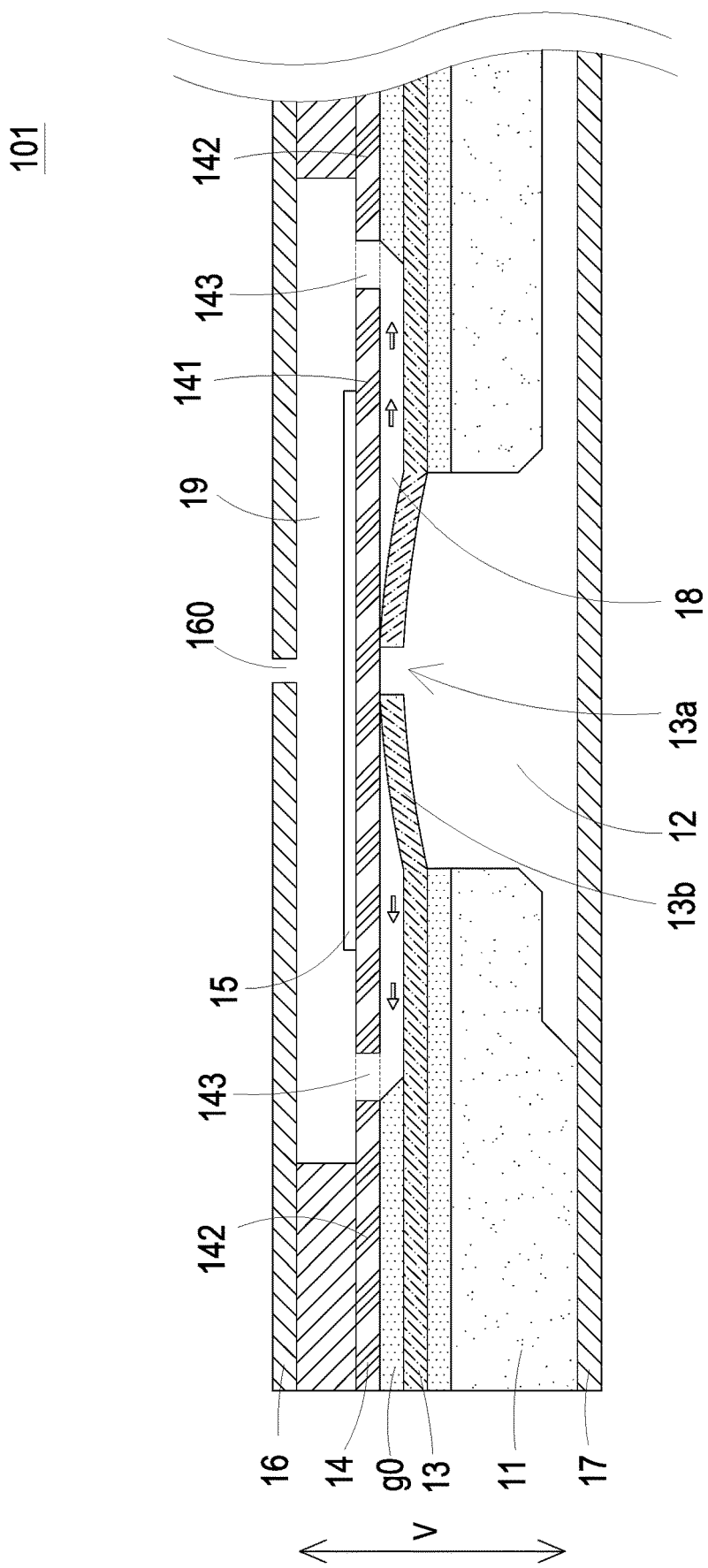
Figure 6D:
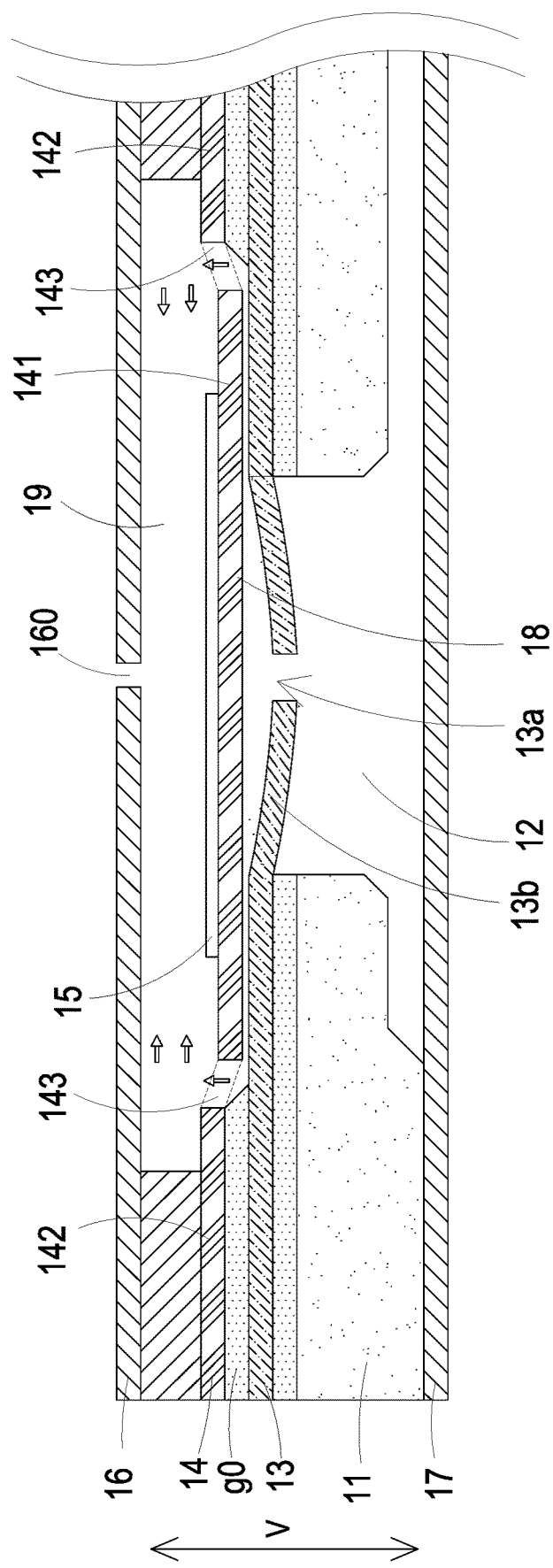

FIG. 6A is a fragmentary cross-sectional view illustrating one of the flow guiding units of the fluid device according to some embodiments of the present disclosure. FIGS. 6B to 6D are schematic diagrams illustrating actuations of the one of the flow guiding units of the fluid device according to some embodiments of the present disclosure. According to the above-mentioned descriptions, the control method of the fluid device 1 provided by the present disclosure can be understood. Furthermore, in order to explain actuation processes of the flow guiding units 101 to 140 for fluid transportation, the actuation processes are described as follows. Referring to FIGS. 6A to 6D, in order to facilitate the description of the structure of the fluid device 1 and the manner of the fluid control, the following description will be made with one flow guiding unit 101, but it is not limited to the present disclosure where there is only one flow guiding unit 101. The flow guiding units 101 to 140 having same structures may be utilized to form the fluid device 1, and the number thereof may be varied according to the practical requirements. Firstly, the flow guide unit 101 of the fluid device 1 shown in FIG. 6A is in a non-driven state (i.e., an initial state). The gap g0 is formed between the resonance membrane 13 and the actuating membrane 14 so that a proper depth between the resonance membrane 13 and the suspension part 141 of the actuating membrane 14 can be maintained. Thus, the fluid can be transported more rapidly, the contact interference between the suspension part 141 and the resonance membrane 13 can also be reduced, and the generated noise can be largely reduced, but the present disclosure is not limited thereto.

As shown in FIG. 6B, when the actuating membrane 14 of the flow guiding unit 101 is driven by the piezoelectric membrane 15, the suspension part 141 of the actuating membrane 14 vibrates away from the inlet plat 17 to enlarge the volume of the first chamber 18 and reduce the pressure in the first chamber 18. Thus, the fluid is inhaled via the inlet aperture 170 of the inlet plate 17 in response to the external pressure and is transported into the convergence chamber 12 of the substrate 11. Afterward, the fluid flows into the first chamber 18 via the central aperture 13a of the resonance membrane 13.

Then, as shown in FIG. 6C, due to the vibration of the suspension part 141 of the actuating membrane 14 of the flow guiding unit 101, the movable part 13b of the resonance membrane 13 is driven to vibrate away from the inlet plate 17 in resonance, and the suspension part 141 of the actuating membrane 14 also returns to its original position, where the flow guide unit 101 of the fluid device 1 is in the non-driven state, at the same time. Consequently, the movable part 13b of the resonance membrane 13 is attached to and abuts against the suspension part 141 of the actuating membrane 14, and the central aperture 13a of the resonance membrane 13 is no longer in communication with the first chamber 18. Thus, the first chamber 18 is compressed, the volume of the first chamber 18 is reduced, and the pressure in the first chamber 18 is increased. The volume of the second chamber 19 is correspondingly enlarged and the pressure of the second chamber 19 is correspondingly decreased. Under this circumstance, the pressure gradient occurs to push the fluid in the first chamber 18 to move toward a peripheral portion of the first chamber 18 and to flow into the second chamber 19 through the interspaces 143 of the actuating membrane 14.

Furthermore, as shown in FIG. 6D, the suspension part 141 of the actuating membrane 14 of the flow guiding unit 101 vibrates toward the inlet plate 17 and drives the movable part 13b of the resonance membrane 13 to vibrate toward the inlet plate 17 correspondingly, so as to further compress the first chamber 18. In such a manner, most of the fluid is transported into the second chamber 19 and is temporarily stored, so as to allow a great amount of fluid to be discharged. Finally, the suspension part 141 of the actuating plate 14 of the flow guiding unit 101 returns to its original position, where the flow guide unit 101 of the fluid device 1 is in the non-driven state, to compress the volume of the second chamber 19 and to increase the pressure in the second chamber 19. Thus, the fluid stored in the second chamber 19 is discharged out of the outlet plate 16 through the outlet aperture 160 so as to accomplish a fluid transportation process. Since the suspension part 141 of the actuating membrane 14 vibrates away from the inlet plate 17 and the movable part 13b of the resonance membrane 13 vibrates toward the inlet plate 17 at the same time, the volume of the first chamber 18 is enlarged and the pressure in the first chamber 18 is reduced. Consequently, the fluid is inhaled via the inlet aperture 170 of the inlet plate 17 in response to the external pressure, is transported into the convergence chamber 12 of the substrate 11 and flows into the first chamber 18 via the central aperture 13a of the resonance membrane 13. By repeating the above-mentioned actuation processes of the flow guiding unit 101 shown in FIGS. 6B to 6D, the suspension part 141 of the actuating plate 14 and the movable part 13b of the resonance plate 13 continuously vibrate in the vibration direction (V) in the reciprocating manner, and the fluid can be continuously inhaled into the inlet aperture 170 and be discharged from the outlet aperture 160, so as to accomplish the fluid transportation process. In this way, the pressure gradient is generated in flow channels of each of the flow guiding units 101 to 140 of the fluid device 1 so as to transport the fluid at a high speed. Moreover, since there is an impedance difference between an inlet direction and an outlet direction, the fluid can be transported from an inhale end to a discharge end. Even if a gas pressure exists at the discharge end, the fluid can still be discharged while achieving the silent efficacy. In some other embodiments, the vibration frequency of the resonance membrane 13 may be the same as the vibration frequency of the actuating membrane 14. Namely, both of the resonance membrane 13 and the actuating membrane 14 may move in the same direction at the same time. The actuation processes can be adjustable according to the practical requirements, but are not limited to that of the embodiments.

Figure 7:
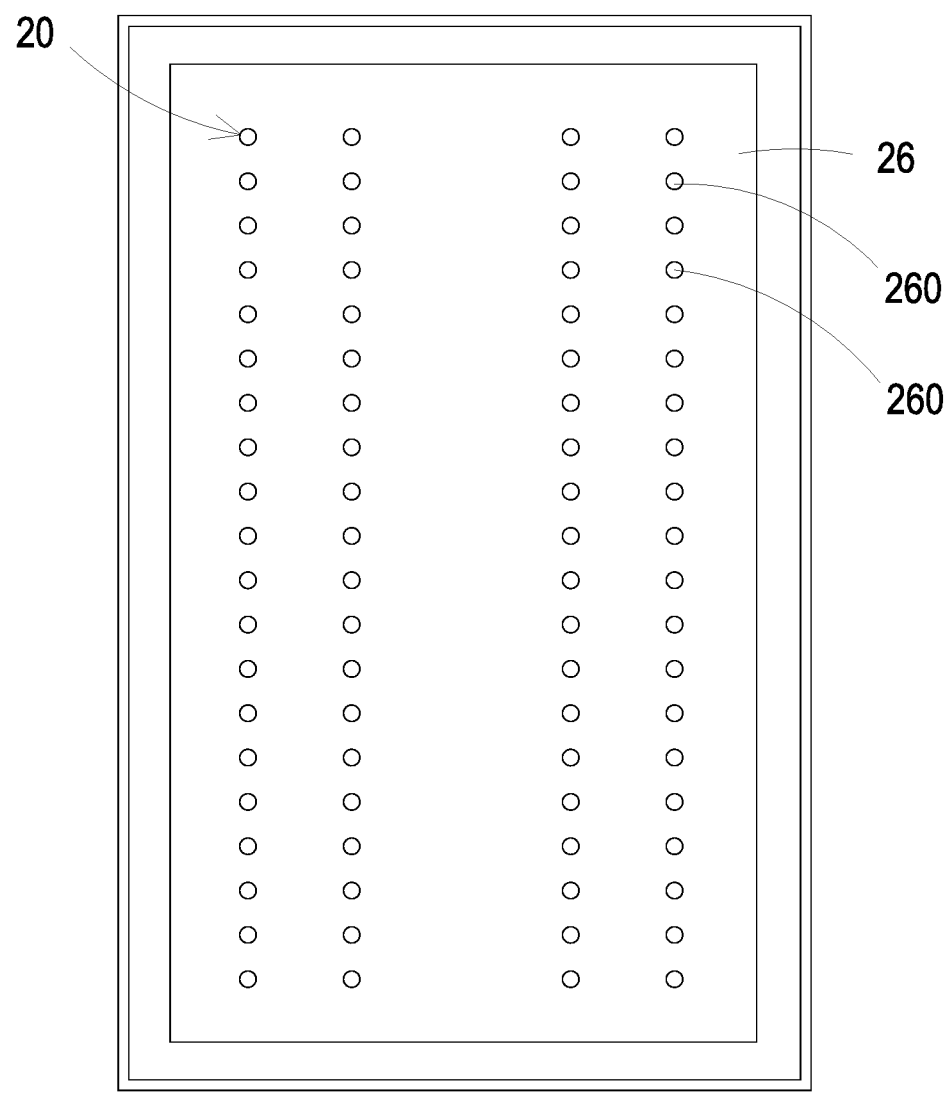
FIG. 7 is a schematic top view illustrating the fluid device according to a second embodiment of the present disclosure.

FIG. 7 is a schematic top view illustrating the fluid device according to a second embodiment of the present disclosure. As shown in FIG. 7, in a second embodiment of the present disclosure, a fluid device 2 includes a plurality of flow guiding units 20 and the number of the flow guiding units 20 is 80. Outlet apertures 260 of an outlet plate 26 respectively represent the flow guiding units 20. In other words, the fluid device 2 includes 80 flow guiding units 20, which can be controlled to individually transport the fluid. The structure of each flow guiding unit 20 is similar to that of the first embodiment, and the difference resides only in the number and the arrangement thereof. The structure thereof will not be redundantly described hereafter. In the second embodiment, the 80 flow guiding units 20 are arranged in four rows, each of the four rows has 20 flow guiding units 20, and the four rows are juxtaposed from each other, but are not limited thereto. The number and the arrangement of the 80 flow guiding units 20 may be varied according to the practical requirements. By simultaneously driving the 80 flow guiding units 20 to transport the fluid, a greater flow rate of the fluid transportation compared to the first embodiment can be achieved. Moreover, the 80 flow guiding units 20 may be divided into a plurality of groups to be controlled group by group. The control method is similar to that of the first embodiment, and will not be redundantly described herein. Thus, it facilitates the fluid device 2 to control the flow rate of the fluid transportation in a wider range. Therefore, the fluid device 2 is more flexible and applicable to all types of apparatuses that require to transport a great amount of fluid, but is not limited thereto.

Figure 8:
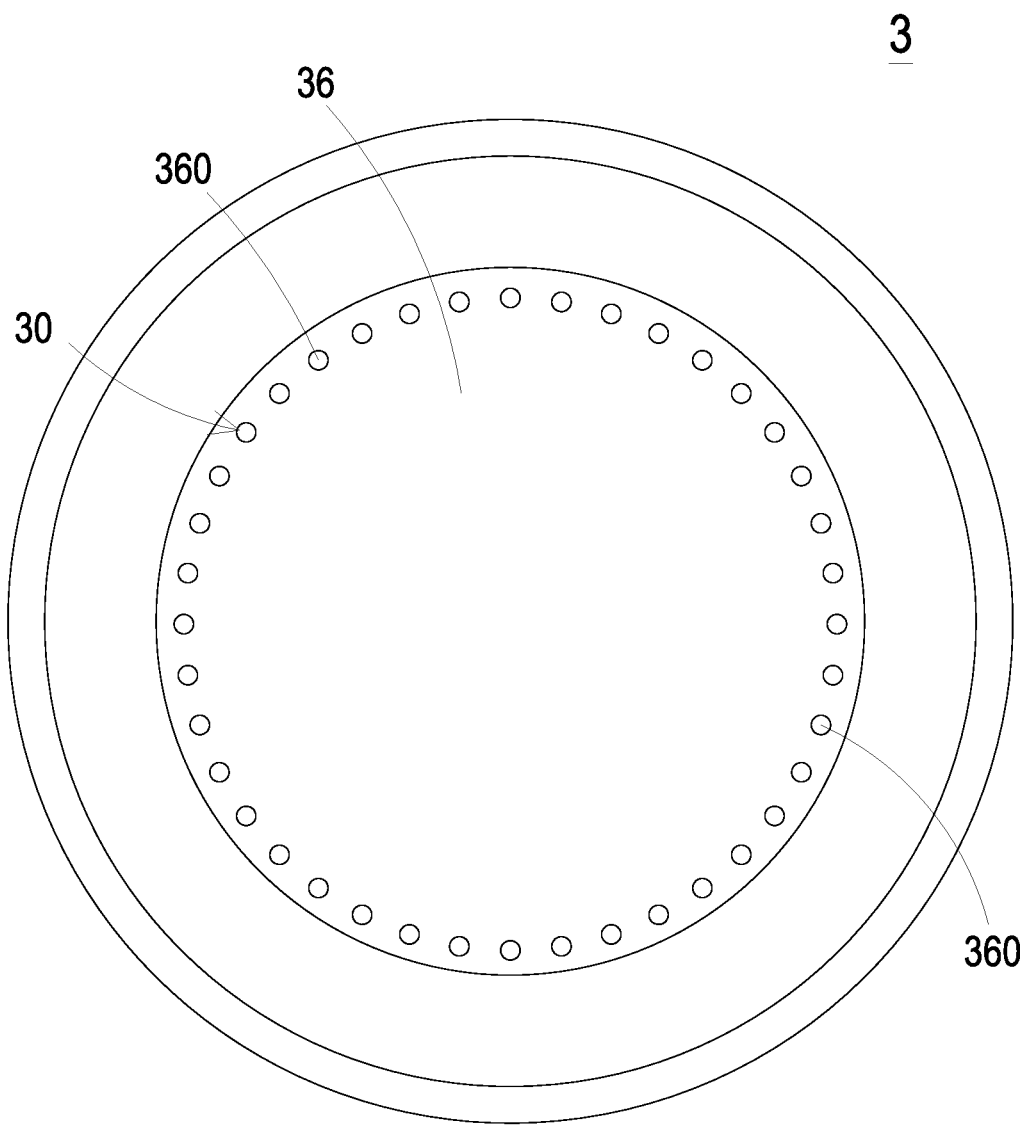
FIG. 8 is a schematic top view illustrating the fluid device according to a third embodiment of the present disclosure.

FIG. 8 is a schematic top view illustrating the fluid device according to a third embodiment of the present disclosure. As shown in FIG. 8, in a third embodiment of the present disclosure, a fluid device 3 has a circular structure and includes a plurality of flow guiding units 30. Outlet apertures 360 of an outlet plate 36 respectively represent the flow guiding units 30. In other words, the fluid device 3 includes 40 flow guiding units 30, and each of the 40 flow guiding units 30 can be controlled to individually transport the fluid. The structure of each of the flow guiding units 30 is similar to that of in the first embodiment, and the differences between the third embodiment and the first embodiment reside in the number and the arrangement of the flow guiding units 30. In the third embodiment, the 40 flow guiding units 30 are annularly arranged, so that the fluid device 3 can be applied in various round or circular fluid transportation channels. The number and the arrangement of the 40 flow guiding units 30 may be varied according to the practical requirements. Moreover, the 40 flow guiding units 30 may be divided into a plurality of groups to be controlled group by group. The control method in the third embodiment is similar to that of the first embodiment, and will not be redundantly described hereafter. By utilizing the control method of the present disclosure, it facilitates the fluid device 3 to save energy, to extend the service life of the components thereof, and facilitates the application of the fluid device to meet various shapes of the required devices. In some other embodiments, the flow guiding units 101 to 140 may be arranged to form a honeycomb pattern (not shown), but is not limited thereto.

In summary, the present disclosure provides a control method of a fluid device. The fluid device includes a plurality of flow guiding units integrally manufactured by a micro-electro-mechanical-system process, so as to improve the transportation efficiency. Moreover, the flow guiding units are divided into a plurality of groups to be controlled group by group, so that the fluid device can be controlled to discharge a specific amount of fluid. In other words, the control method of the fluid device is industrially valuable.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A control method of a fluid device, comprising steps of:
   (a) providing the fluid device, which is integrally manufactured by a micro-electro-mechanical-system process, wherein a plurality of flow guiding units are manufactured by the micro-electro-mechanical-system process and are connected to each other to integrally form the fluid device which is an one piece structure, wherein each of the flow guiding units includes an inlet plate, a substrate, a resonance membrane, an actuating membrane, a piezoelectric membrane and an outlet plate which are stacked sequentially, wherein the resonance membrane has a central aperture and a movable part, wherein a convergence chamber is formed between the resonance membrane and the inlet plate, wherein the actuating membrane is in the form of a hollow and suspension structure, wherein a surface of a material is micro-machined by means of dry and wet etching in the micro-electro-mechanical-system process to form the fluid device, wherein the resonance membrane and the actuating membrane of any adjacent two of flow guiding units are all integrally formed;
   (b) dividing the flow guiding units into a plurality of groups so as to be controlled group by group, wherein the groups are electrically connected to a control module, and wherein any two adjacent ones of the flow guiding units are controlled to be actuated and shut down asynchronously and independently; and
   (c) generating a driving signal by the control module for a corresponding one of the groups, wherein the control module generates an actuating signal to a specific one of the groups, so that the flow guiding units of the specific one of the groups are driven to transport fluid, and thereby controlling the fluid device to discharge a specific amount of fluid.

2. The control method of the fluid device according to claim 1, wherein the inlet plate has at least one inlet aperture, wherein the resonance membrane is, in each flow guiding unit, a suspension structure manufactured by a surface micromachining process, wherein the actuating membrane is manufactured by the surface micromachining process, and has a suspension part, an outer frame and at least one interspace wherein the piezoelectric membrane is attached on a surface of the suspension part of the actuating membrane, wherein the outlet plate has an outlet aperture, wherein a gap formed between the resonance membrane and the actuating membrane is defined as a first chamber, and a second chamber is formed between the actuating membrane and the outlet plate, wherein while the piezoelectric membrane is driven to drive the actuating membrane, the fluid is inhaled into the convergence chamber via the inlet aperture of the inlet plate, is transported into the first chamber via the central aperture of the resonance membrane, is transported into the second chamber via the at least one interspace, and is discharged out from the outlet aperture of the outlet plate, so as to control the flowing of the fluid.

3. The control method of the fluid device according to claim 2, wherein each actuating membrane is a metallic membrane or a polysilicon membrane.

4. The control method of the fluid device according to claim 2, wherein each piezoelectric membrane is a metal oxide membrane manufactured by a sol-gel process.

5. The control method of the fluid device according to claim 2, wherein each piezoelectric membrane has an anode and a cathode disposed for driving a vibration of the piezoelectric membrane.

6. A control method of a fluid device, comprising steps of:
   (a) providing the fluid device, which is integrally manufactured by a micro-electro-mechanical-system process, wherein a plurality of flow guiding units are manufactured by the micro-electro-mechanical-system process and are connected to each other to integrally form the fluid device which is an one piece structure, wherein each of the flow guiding units includes an inlet plate, a substrate, a resonance membrane, an actuating membrane, a piezoelectric membrane and an outlet plate which are stacked sequentially, wherein the resonance membrane has a central aperture and a movable part, wherein a convergence chamber is formed between the resonance membrane and the inlet plate, wherein the actuating membrane is in the form of a hollow and suspension structure, wherein a surface of a material is micro-machined by means of dry and wet etching in the micro-electro-mechanical-system process to form the fluid device, wherein the resonance membrane and the actuating membrane of any adjacent two of flow guiding units are all integrally formed;
   (b) dividing the flow guiding units into a plurality of groups so as to be controlled group by group, wherein the groups are electrically connected to at least one control module, and wherein any two adjacent ones of the flow guiding units are controlled to be actuated and shut down asynchronously and independently; and (c) generating at least one driving signal by the control module for at least one of the groups, wherein the control module generates at least one actuating signal to a specific one of the groups, so that the flow guiding units of the specific one of the groups are driven to transport fluid, and thereby controlling the fluid device to discharge a specific amount of fluid.

* * * * *